United States Patent
Cho et al.

(10) Patent No.: US 7,751,239 B2
(45) Date of Patent: Jul. 6, 2010

(54) DEVICE FOR READING MEMORY DATA AND METHOD USING THE SAME

(75) Inventors: Kyoung Lae Cho, Yongin-si (KR); Jun Jin Kong, Yongin-si (KR); Dong Hyuk Chae, Seoul (KR); Seung Jae Lee, Hwaseong-si (KR); Sung-Jae Byun, Yongin-si (KR); Dong Ku Kang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 232 days.

(21) Appl. No.: 11/907,082

(22) Filed: Oct. 9, 2007

(65) Prior Publication Data

US 2009/0196097 A1    Aug. 6, 2009

(30) Foreign Application Priority Data

May 30, 2007    (KR)    .................... 10-2007-0052848

(51) Int. Cl.
*G11C 11/34* (2006.01)

(52) U.S. Cl. ............................ 365/185.03; 365/185.17; 365/185.18; 365/185.2; 365/185.21; 365/185.24; 365/185.29; 365/185.33

(58) Field of Classification Search ............ 365/185.03, 365/185.17, 185.18, 185.2, 185.21, 185.24, 365/185.33
See application file for complete search history.

(56) References Cited

U.S. PATENT DOCUMENTS

| | | | | |
|---|---|---|---|---|
| 6,414,876 B1 * | 7/2002 | Harari et al. | ............ | 365/185.03 |
| 6,567,304 B1 * | 5/2003 | Kleveland | .............. | 365/185.03 |
| 6,906,951 B2 * | 6/2005 | Wong | .................... | 365/185.03 |
| 7,215,575 B2 * | 5/2007 | Chen et al. | ............. | 365/185.03 |
| 7,298,648 B2 * | 11/2007 | Lee et al. | ............... | 365/185.03 |
| 7,369,434 B2 * | 5/2008 | Radke | .................... | 365/185.03 |
| 7,388,779 B2 * | 6/2008 | Nazarian | ............... | 365/185.03 |
| 7,394,697 B2 * | 7/2008 | Jyouno et al. | .......... | 365/185.03 |
| 7,489,544 B2 * | 2/2009 | Kim et al. | .............. | 365/185.03 |
| 7,489,547 B2 * | 2/2009 | Moogat et al. | ......... | 365/185.03 |
| 2002/0196171 A1 | 12/2002 | Micheloni et al. | | |

(Continued)

FOREIGN PATENT DOCUMENTS

JP    2000-228092    8/2000

(Continued)

OTHER PUBLICATIONS

Notice of Allowance dated May 27, 2008 for corresponding Korean Application No. 2007-0052848.

*Primary Examiner*—Trong Phan
(74) *Attorney, Agent, or Firm*—Harness, Dickey & Pierce, P.L.C.

(57) ABSTRACT

Provided are a device for reading memory data and a method using the same. The device for reading memory data comprises a memory cell which stores multi-bit information, an information detection unit which detects as much bit information as a predetermined number of bits from among multi-bit information, a source-line voltage control unit which controls a source-line voltage of the memory cell based on the detected bit information from the information detection unit, and a remaining bit information read unit which reads remaining bit information stored in the memory cell by using the controlled source-line voltage.

1 Claim, 6 Drawing Sheets

U.S. PATENT DOCUMENTS

2006/0101193 A1   5/2006   Murin

FOREIGN PATENT DOCUMENTS

| KR | 98-024690 | 7/1998 |
| KR | 2000-0023177 | 4/2000 |
| KR | 102001000197 | 1/2001 |
| KR | 2001-0077273 | 8/2001 |
| KR | 2007-0004295 | 1/2007 |

* cited by examiner ced data is read without frequently changing
DEVICE FOR READING MEMORY DATA AND METHOD USING THE SAME

CROSS-REFERENCE TO RELATED APPLICATION

This application claims the benefit of Korean Patent Application No. 10-2007-0052848, filed on May 30, 2007, in the Korean Intellectual Property Office, the entire disclosure of which is incorporated herein by reference.

BACKGROUND OF THE INVENTION

1. Field of the Invention

Methods and apparatuses consistent with the present invention relate to reading memory data. More particularly, methods and apparatuses consistent with the present invention relate to reading memory data which can rapidly read multi-bit information stored in memory cells consisting of a flash memory.

2. Description of Related Art

Currently, demands for a large-volume memory have been exponentially increased, and accordingly, recent research relating to the large-volume memory has been actively undertaken. Particularly, demands for a flash memory capable of reducing power consumption and maintaining stored data without power supply have been increased every year.

Flash memory advantageously maintains stored data without power supply in comparison with a related art DRAM, and allows data to be electrically inputted/outputted, and thus, a range of applications for the flash memory is greatly expanded. Hereinafter, the flash memory and the related arts will be described.

The flash memory is mainly classified into a NAND flash memory which is useful in a large-scale integration and provides a large storage volume, and a NOR flash memory which has a relatively fast read speed. The NAND flash memory lags the NOR flash memory in the read speed, but can be implemented by highly integrating the memory cell. Particularly, modern day NAND flash memory devices electrically program and erase memory cells to store and maintain data.

Generally, the flash memory includes a plurality of memory cells. The memory cell can be implemented by using a transistor. Also, the transistor includes a drain, a source, a gate, and a floating gate. Generally, in the DRAM, electrons are stored in a capacitor, and the stored electrons in the capacitor are detected and thereby allow data stored in the DRAM to be detected. Unlike this, a method of storing data in the memory cell including the transistor is performed such that a threshold voltage of the transistor is changed by charging electric stimulation to the memory cell from the outside.

For example, when a positive high voltage is applied to a gate of the transistor, electrons are accumulated in the floating gate by Fowler-Nordheim tunneling effect. As electrons are accumulated in the floating gate, the threshold voltage of the transistor is increased. Conversely, as the accumulated electrons in the floating gate are discharged, the threshold voltage of the transistor is reduced. According to a principle of the change of the threshold voltage, data is stored in the memory cell and detected.

Two methods of storing data in the flash memory have been mainly proposed. Of these, a Single Level Cell (SLC) method is conducted such that threshold voltages of transistors are determined into one threshold voltage. As for the SLC method, when a predetermined voltage is applied to a gate of the transistor, data stored in the memory cell is detected depending on whether the transistor is either ON or OFF.

As demands for the large volume flash memory are currently increasing, a Multi Level Cell (MLC) method draws attention. The MLC method is to multiplex the threshold voltage of the transistor included in the memory cell. For example, when 4-bit data is stored, the threshold voltage of the transistor is set into 16 levels, and data is then assigned in accordance with each level. Thus, the MLC method surpasses SLC method in storing large-volume data.

For example, the threshold voltage of the transistor theoretically has 16 values in the memory cell in which 4-bit data is stored and the MLC method is adapted. However, realistically, the threshold voltage does not exactly have 16 values, and is separated into 16 regions and distributed. Further, corresponding data is stored in each region of 16 regions. To read data stored in the memory cell by the MLC method, a data value which is stored in the memory cell with respect to each region of 16 regions is required to be determined. Thus, to read data stored in a 4-bit memory cell, 15 gate voltages should be sequentially applied.

In particular, the NAND flash memory includes a memory cell array. The memory cell array is formed by arranging a plurality of memory cells in transversal and longitudinal directions. Generally, a plurality of bit lines are used to connect memory cells on transversal rows and a plurality of word lines are used to connect memory cells on longitudinal columns.

For example, we assume that a number of word lines is N, that is, WL1, WL2, ..., WLN. Since, it is unknown which region each threshold voltage of memory cells connected with word lines is included, every region in which threshold voltages are included should be determined. Specifically, when 4-bit data is stored in the memory cell, reading should be performed while word line voltages of WLN is being changed 15 times. As a result, the flash memory of the MLC method has a shortcoming in which a read speed is relatively low.

Therefore, there is a need for apparatuses and methods for reading memory data in which the read speed is increased while taking advantage of the MLC method.

SUMMARY OF THE INVENTION

An aspect of the present invention provides a device and a method for reading memory data in which a read speed is significantly increased by controlling a source-line voltage of a memory cell.

An aspect of the present invention provides a device and a method for reading memory data in which a source-line voltage of a memory cell is appropriately controlled, so that data stored in the memory cell is read without frequently changing a gate voltage applied to the memory cell.

An aspect of the present invention provides a device and a method for reading memory data in which predetermined bit information is detected, from among multi-bit information stored in a memory cell, and used, so that data stored in the memory cell is rapidly and accurately read.

An aspect of the present invention provides a device and a method for reading memory data in which a number of times reading memory data is performed is effectively reduced, so that overall performance of the memory device is improved.

According to an aspect of the present invention, there is provided a device for reading memory data comprising a memory cell which stores multi-bit information; an information detection unit which detects as much bit information as a predetermined number of bits from among multi-bit information; a source-line voltage control unit which controls a source-line voltage of the memory cell based on the detected bit information from the information detection unit; and a remaining bit information read unit which reads remaining bit information stored in the memory cell by using the controlled source-line voltage.

In this instance, the source-line voltage control unit may include a threshold voltage determination unit which determines a range of a region where a threshold voltage of the memory cell is included, by using the detected bit information from the information detection unit; and a source-line voltage supply unit which supplies the source-line voltage of the memory cell according to the range of the region where the threshold voltage is included.

Also, the remaining bit information read unit may supply a reference voltage to a gate of the memory cell, and read the remaining bit information depending on whether a difference between the source-line voltage supplied by the source-line voltage supply unit and the reference voltage is greater than the threshold voltage of the memory cell.

Also, the memory cell may be a flash memory of a Multi-Level Cell (MLC) method.

Also, the multi-bit information may be stored in the memory cell by a grey code scheme.

Also, the information detection unit may maintain the source-line voltage of the memory cell to be constant and control a gate voltage of the memory cell, and thereby detects the bit information.

Also, the information detection unit may detect as much bit information as N/2 number of bits when N-bit information is stored in the memory cell.

According to another aspect of the present invention, there is provided a method of reading memory data comprising detecting as much bit information as a predetermined number of bits from among multi-bit information stored in the memory cell; controlling a source-line voltage of the memory cell based on the detected bit information; and reading remaining bit information stored in the memory cell by using the controlled source-line voltage.

BRIEF DESCRIPTION OF THE DRAWINGS

The above and other aspects of the present invention will become apparent and more readily appreciated from the following detailed description of certain exemplary embodiments of the invention, taken in conjunction with the accompanying drawings of which.

DETAILED DESCRIPTION OF EXEMPLARY EMBODIMENTS

Figure 1:
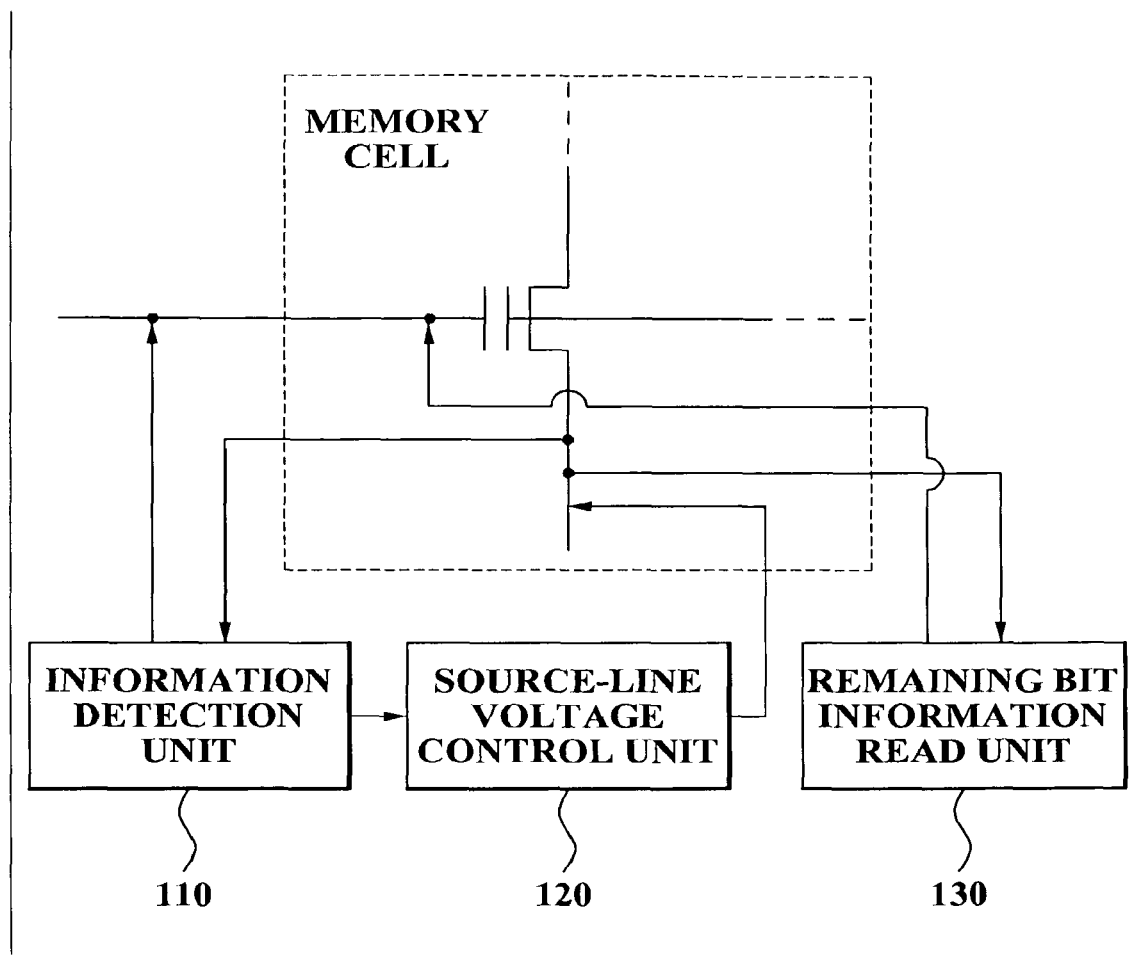
FIG. 1 is a block diagram illustrating a device for reading memory data according to an exemplary embodiment of the present invention.

Reference will now be made in detail to exemplary embodiments of the present invention, examples of which are illustrated in the accompanying drawings, wherein like reference numerals refer to the like elements throughout. The exemplary embodiments are described below in order to explain the present invention by referring to the figures.

FIG. 1 is a block diagram illustrating a device for reading memory data according to an exemplary embodiment of the present invention.

Referring to FIG. 1, a device for reading memory data according to an exemplary embodiment of the present invention includes an information detection unit 110, a source-line voltage control unit 120, and a remaining bit information read unit 130, so that data stored in a memory cell 100 can be read.

Multi-bit information is stored in the memory cell 100.

The information detection unit 110 detects as much bit information as a predetermined number of bits from among multi-bit information stored in the memory cell 100.

In this instance, the memory cell 100 may be a flash memory of Multi Level Cell (MLC) method. In general, a memory cell includes transistors. Particularly, transistor having floating gate may be used in a NAND flash memory. Unlike related art transistors, a transistor having floating gate includes a plurality of threshold voltages. Specifically, when a positive high voltage is applied to a gate node of the transistor, electrons existing on the substrate of the transistor are tunneled and thereby are accumulated in the floating gate. Electrons accumulated in the floating gate can change a threshold voltage of the transistor. Thus, the threshold voltage of the transistor can be determined depending on the amount of electrons accumulated in the floating gate.

Unlike a memory cell of a Single Level Cell (SLC) method having a single threshold voltage, in the memory cell of the MLC method, data having multiple can be stored by using multi-threshold voltages.

When a source-line of the memory cell is grounded, the memory cell of the SLC method includes a single threshold voltage. Thus, data stored in the memory cell is determined depending on whether a voltage applied to the gate of the memory cell is greater than the threshold voltage of the memory cell. For example, when the voltage applied to the gate is greater than the threshold voltage and thereby allows the transistor to be ON, it is determined that '1' is stored in the memory cell. Conversely, when the voltage applied to the gate is lower than the threshold voltage and thereby allows the transistor to be OFF, it is determined that '0' is stored in the memory cell. Thus, since either '0' or '1' is stored as data in one memory cell of the SLC method, 1-bit data is stored.

Unlike this, the memory cell of the MLC method has a plurality of threshold voltages, that is, includes a plurality of threshold voltages depending on a quantity of charge accumulated in the floating gate. Specifically, when the memory cell of the MLC method is programmed to have a predetermined threshold voltage, the memory cell has a threshold voltage close to the predetermined threshold voltage. Thus, threshold voltages which are within a predetermined range from a desired threshold voltage have the same data. Specifically, when threshold voltages are within a predetermined range, the memory cell has the same data. Therefore, a plurality of regions of threshold voltage having the same data is determined, so that multi-bit information (data) can be stored in a single memory cell.

In this instance, multi-bit information stored in the memory cell 100 may be stored as a code-type having different sequences. As an example, the multi-bit information stored in the memory cell 100 can be stored in the memory cell 100 by a grey code scheme. The grey code scheme refers to as a code where only one bit is different and remaining bits are the same from/with one another in consecutive data. For example, a 4-bit grey code is represented as '1111', '1110', '1100' and '1101' in order.

Here, we assume that the memory cell 100 stores 4-bit data. In this instance, a threshold voltage of the memory cell 100 may be included in any one of regions of the threshold voltage divided into 16 threshold voltages. Specifically, when it is determined that threshold voltage of the memory cell 100 is included in any one of 16 threshold voltage regions, the memory cell 100 is determined to store data corresponding to the threshold voltage region.

We assume that data stored in the memory cell 100 is '1011'. The information detection unit 110 detects as much bit information as a predetermined number of bits from among the multi-bit information. For example, when the predetermined number of bits is '2', the information detection unit 110 may detect 2-bits of a higher order, that is, '10' and may detect 2-bits of a lower order, that is, '11'.

In this instance, when N-bit information is stored in the memory cell 100, the information detection unit 110 detects as much bit information as N/2 number of bits.

In this instance, the information detection unit 110 maintains a source-line voltage of the memory cell to be constant and controls a gate voltage of the memory cell, and thereby detects the bit information. For example, when a source-line of the memory cell 100 is grounded, and thereby allows a source-line voltage to be maintained at a constant '0V', a gate voltage is sequentially changed, and thus whether a transistor is ON is determined. According to the above determined result, bit information stored in the memory cell 100 may be detected.

In this instance, the source-line voltage control unit 120 controls a source-line voltage of the memory cell 100 based on the detected bit information from the information detection unit 110.

For example, when the memory cell stores 4-bit data, the information detection unit 110 detects 2-bit information. Here, the information detection unit 110 controls a gate voltage and thereby detects 2-bit information.

In this instance, the device for reading memory data according to the present exemplary embodiment is required to read remaining 2-bit information. In this instance, the source-line voltage control unit 120 controls a source-line voltage to detect remaining 2-bit information by using 2-bit information detected from the information detection unit 110. Specifically, in order to read remaining 2-bit information stored in the memory cell 100, the source-line voltage instead of the gate voltage is sequentially changed corresponding to 16 threshold voltage regions, so that data stored in the memory cell 100 is rapidly read by determining in which region a threshold voltage of the memory cell is included.

This is because data stored in the memory cell is basically read depending on whether a difference between the source-line voltage and the gate voltage is greater than the threshold voltage. As a result, data stored in the memory cell can be read by changing the source-line voltage even when the gate voltage is maintained to be constant.

In this instance, the remaining bit information read unit 130 reads the remaining bit information stored in the memory cell by using the controlled source-line voltage. Specifically, the remaining bit information is read depending on whether a difference between the controlled source-line voltage and the applied gate voltage is greater than the threshold voltage.

Figure 2:
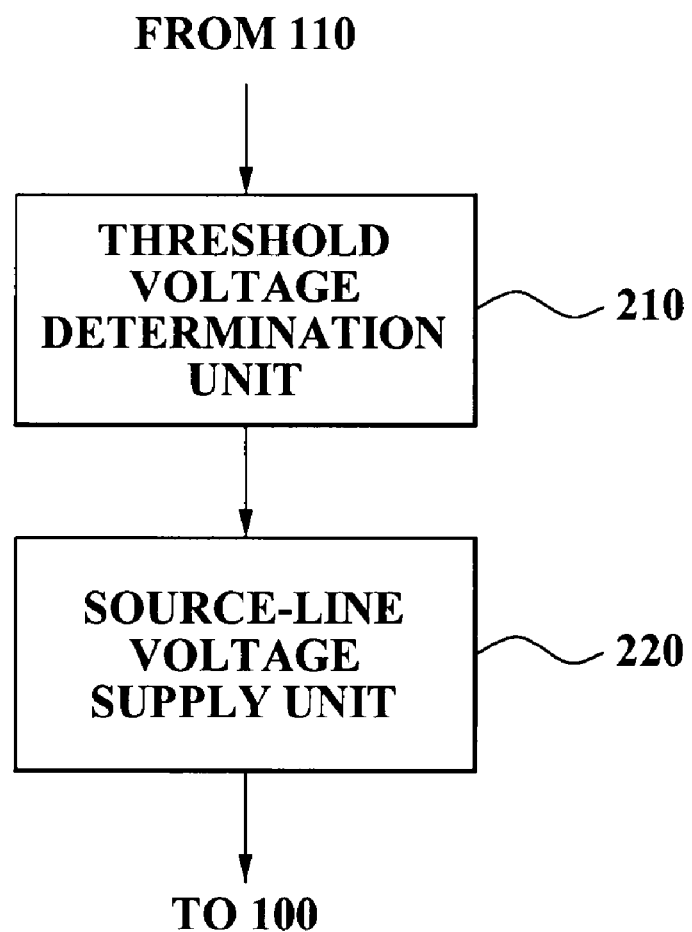
FIG. 2 is a block diagram illustrating an example of a source-line voltage control unit of FIG. 1.

FIG. 2 is a block diagram illustrating an example of a source-line voltage control unit 120 of FIG. 1.

Referring to FIG. 2, the source-line voltage control unit 120 includes a threshold voltage determination unit 210, and a source-line voltage supply unit 220.

The threshold voltage determination unit 210 determines a range of a region where a threshold voltage of the memory cell is included, by using the detected bit information from the information detection unit 110.

For example, we assume that the information detection unit 110 detects two bit information in the memory cell capable of storing 4-bit data. In this instance, there are 16 threshold voltage regions in total in the 4-bit memory cell, and each threshold voltage region corresponds to 4-bit data. When 1-bit information among 4-bit information is determined, the threshold voltage of the memory cell is determined to be included in any one of 8 threshold voltage regions. Also, when 2-bit information among 4-bit information is determined, the threshold voltage of the memory cell is determined to be included in any one of 4 threshold voltage regions. Thus, the threshold voltage determination unit 210 determines a range of a region where the threshold voltage of the memory cell is included.

Here, the source-line voltage supply unit 220 supplies the source-line voltage of the memory cell according to the range of the region where the threshold voltage is included. Specifically, when it is determined which region the threshold voltage is included, the source-line voltage is controlled without frequently changing the gate voltage, so that data stored in the memory cell is rapidly read.

Although not shown in FIG. 2, the remaining bit information read unit 130 illustrated in FIG. 1 supplies a reference voltage to a gate of the memory cell, and reads the remaining bit information depending on whether a difference between the source-line voltage supplied by the source-line voltage supply unit 220 and the reference voltage is greater than the threshold voltage of the memory cell.

Figure 3:
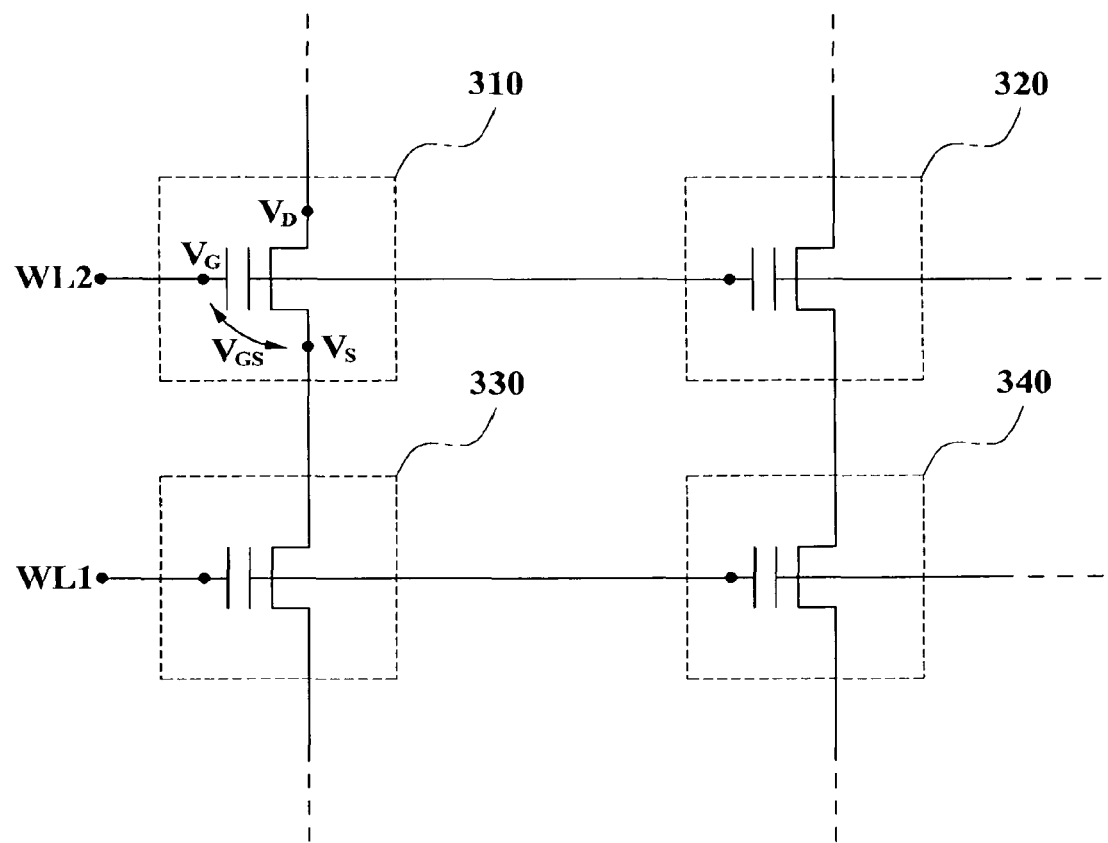
FIG. 3 illustrates a plurality of memory cells according to an exemplary embodiment of the present invention.

FIG. 3 illustrates a plurality of memory cells according to an exemplary embodiment of the present invention. Referring to FIG. 3, each memory cell 310, 320, 330, and 340 is comprised of a transistor. The memory cells 310, 320, 330, and 340 are connected with one another in transversal and longitudinal directions. Also, in order to read data stored in the memory cells 310, 320, 330, and 340, word lines WL1 and WL2 are activated.

Referring to the memory cell 310, the word line WL2 is connected with a gate. An applied gate voltage is $V_G$, a drain voltage is $V_D$, and a source voltage is $V_S$. Also, a difference between the gate voltage and the source voltage is $V_{GS}$.

Data stored in the memory cell 310 is determined depending on a region in which the threshold voltage of the memory cell 310 is included. When the $V_{GS}$ of the memory cell 310 is greater than the threshold voltage of the memory cell 310, the memory cell 310 is ON. Specifically, when it is determined whether the memory cell 310 is either ON or OFF with respect to the predetermined $V_{GS}$, the region in which the threshold of the memory cell 310 is included is determined.

Also, in the case of multi-bit memory cell, multi-bit data stored in the memory cell may be read by determining whether the memory cell is either ON or OFF with respect to different $V_{GS}$s.

Figure 4:
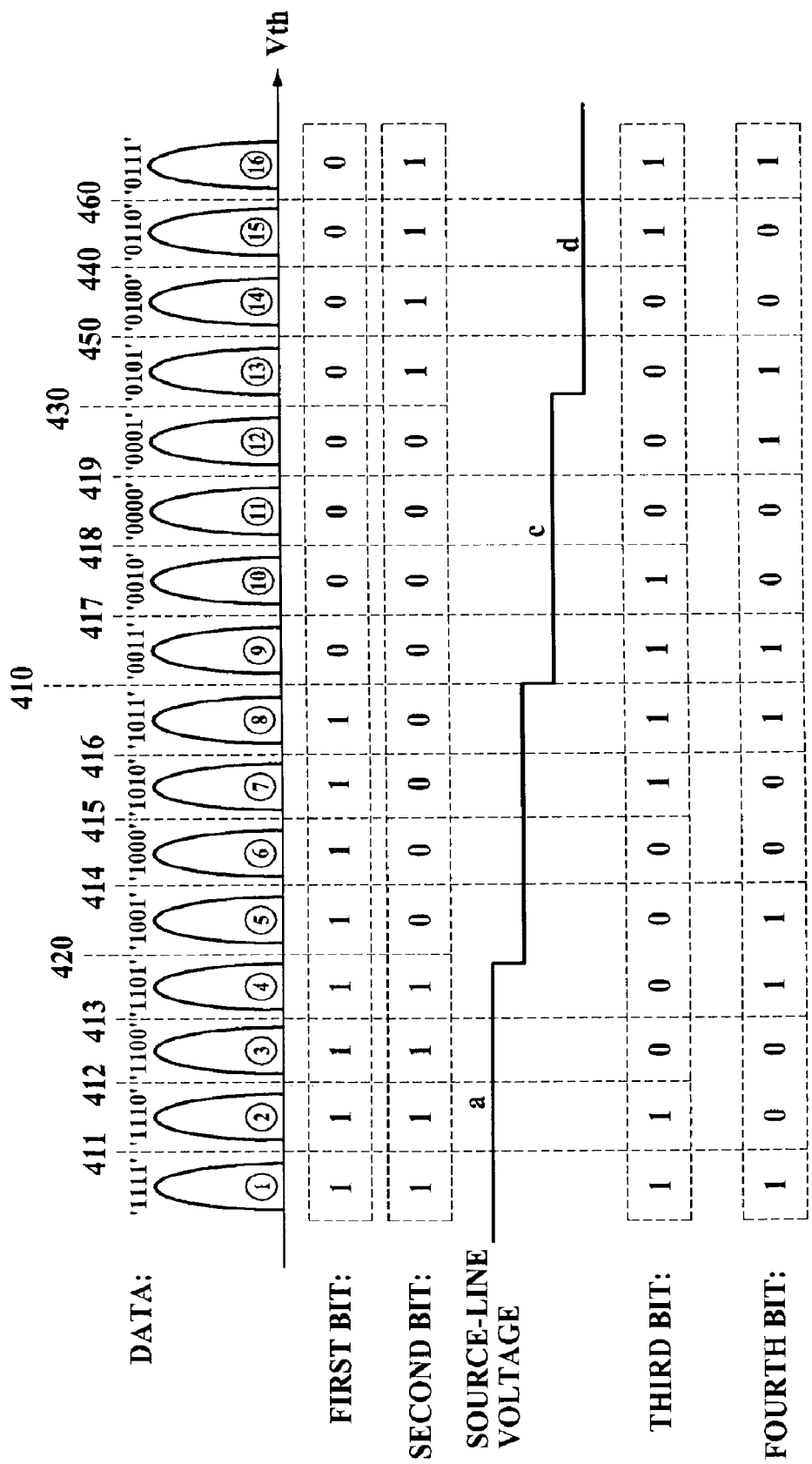
FIG. 4 illustrates a process where multi-bit information stored in memory cells is read according to an exemplary embodiment of the present invention.

FIG. 4 illustrates a process where multi-bit information stored in memory cells is read according to an exemplary embodiment of the present invention.

Referring to FIG. 4, $V_{th}$ denotes a threshold voltage of the memory cell, and 4-bit memory cell has a threshold voltage included in any one region of the 16 regions. Also, 4-bit information corresponds to each region of the 16 regions. As an example, in the case of the grey code format, data '1111' corresponds to ① region from among 16 threshold voltage regions, and data '0011' corresponds to ⑨ region therefrom.

Also, data illustrated in FIG. 4 is stored in the memory cell in the grey code format. For example, each data corresponding to ⑤, ⑥, and ⑦ regions is '1001', '1000', and '1010', which shows that only one bit is different from adjacent data and the remaining bit are the same.

We assume that data '0011' is stored in the memory cell, and a source line voltage is '0V'. In this instance, the threshold voltage of the memory cell is included in ⑨ region. Specifically, in order to read data stored in the memory cell, a region in which the threshold voltage of the memory cell is included should be determined.

In order to read data '0011' stored in the memory cell by a related art method, a gate voltage 410 is applied, thereby determining whether the memory cell is either ON or OFF. Since the threshold voltage of the memory cell is included in ⑨ region, the threshold voltage is greater than the gate voltage 410. As a result, the memory cell is OFF, and a first bit of data stored in the memory cell is read as '0'.

In order to read a second bit of the data in the same manner as the above, gate voltages 420 and 430 should be applied. Memory cells are connected with one another via word lines in the transversal direction. Thus, since the same gate voltage should be applied to the memory cells connected via the same word line, the gate voltage 420 is applied to a gate, and then replaced with the gate voltage 430 to the gate. The reason why the gate voltage 420 is applied is because different memory cells connected via the same word line have '1' as the first bit of the data. For example, this is because '1111' may be stored in different memory cells. In order to obtain a third bit of the data, gate voltages 412, 415, 418, and 440 should be applied. Further, in order to obtain a fourth bit of the data, gate voltages 411, 434, 414, 416, 417, 419, 450, and 460 should be applied. As a result, gate voltages different from one another are applied more than a total of 15 times, thereby reading data stored in the memory cell.

Memory cells according to an exemplary embodiment of the invention will be described hereinafter. We assume that data '0011' is stored in the memory cell, that is, the threshold voltage of the memory cell is included in ⑨ region.

According to the present exemplary embodiment of the invention, the information detection unit detects as much bit information as a predetermined number of bits from among multi-bit information stored in the memory cell. Referring to FIG. 4, the predetermined number of bits is '2', and a process where 2-bit information is detected from a high order level is illustrated. As a result, the information detection unit sequentially applies gate voltages 410, 420, and 430 to a gate of the memory cell, and thereby detects '00', that is, 2-bit information of a high order from among multi-bit stored in the memory cell. In this instance, when the gate voltages 410, 420, and 430 are applied, it is determined whether the memory cell is ON, and thus, '00' of the 2-bit information of the high order can be read. In this instance, a source-line voltage of the memory cell is maintained to be a constant '1V'.

In this instance, the source-line voltage control unit according to an exemplary embodiment of the invention controls a source-line voltage of the memory cell based on '00', that is, bit information detected from the information detection unit.

Specifically, 2-bit information of a high order, that is, '00' denotes that a threshold voltage of the memory cell is included in any one of ⑨, ⑩, ⑪, and ⑫ regions. That is, a range of a region where the threshold voltage of the memory cell is included is ⑨, ⑩, ⑪, and ⑫ regions.

In order to read the remaining 2-bit information of a lower order, when it is determined whether a transistor is either ON or OFF only with respect to ⑨, ⑩, ⑪, and ⑫ regions, a region in which the threshold voltage of the memory cell is included, and accordingly, data stored in the memory cell can be read.

Here, there arise many problems in that only gate voltage 418, 417, and 419 are sequentially applied. This is because data '1110' may be stored in different memory cells connected with one another via the same word line.

Basically, a principle for reading data is to determine whether the memory cell is either ON or OFF when a predetermined $V_{GS}$ is applied. It is noted that the transistor is determined to be either ON or OFF by a difference between an applied gate voltage and a source-line voltage in addition to by the applied gate voltage. As a result, a number of times the gate voltage is applied is significantly reduced by appropriately controlling the source-line voltage.

When as much bit information as a predetermined number of bits is detected from the information detection unit, a reference voltage is supplied to a gate of the memory cell. Specifically, the reference voltage is supplied to gates of memory cells connected via a single word line.

For example, according to the present exemplary embodiment of the invention, in order to read a third bit of data '0011' stored in the memory cell, a gate voltage 440 is supplied to a gate as the reference voltage. In this instance, since the bit information detected from the information detection unit is '00', the source-line voltage control unit elevates the source-line voltage from d to c. Also, in order to read a fourth bit of '0011' stored in the memory cell, a gate voltage 450 is supplied to a gate as the reference voltage. Here, in the source-line voltage control unit, the source-line voltage is supplied as c. Specifically, the source-line voltage is controlled so that a difference between gate voltages 417 and 450 is the same as the difference between source-line voltages d and a. When '1110' is stored in different memory cells from the above, top 2 bits '11' may be detected from the information detection unit. Thus, the threshold voltage of the different memory cells is included in any one from among ①, ②, ③, and ④ regions. Also, in order to read a third bit of data, a gate voltage 440 is supplied to a gate of the different memory cells as the reference voltage, and the source-line of the different memory cells is controlled as a. In order to read a fourth bit of data in the same manner as the above, a gate voltage 460 is applied to a gate of the different memory cell as the reference voltage, and the source-line of the different memory cells is controlled as a. Specifically, a difference between gate voltages 460 and 413 is the same as the difference between source-line voltages a and d.

Therefore, according to the present exemplary embodiment of the invention, since gate voltages 410, 420, 430, 440, and 450 are applied in order to detect data '0011', the number of voltages applied to a gate is significantly reduced in comparison with the related art method. As a result, a read speed of memory data is significantly increased. Since only gate voltages 440, 450, and 460 are applied to gates of memory cells which are connected via the same word line, described with reference to FIG. 4, as reference voltages, the number of voltages applied to the gates is significantly reduced.

As another example, in order to read data '0001', gate voltages 410, 420, 430, 440, 450, and 460 should be applied, and thus the number of voltages applied to the gates is six, which significantly increases the read speed of the memory data.

Figure 5:
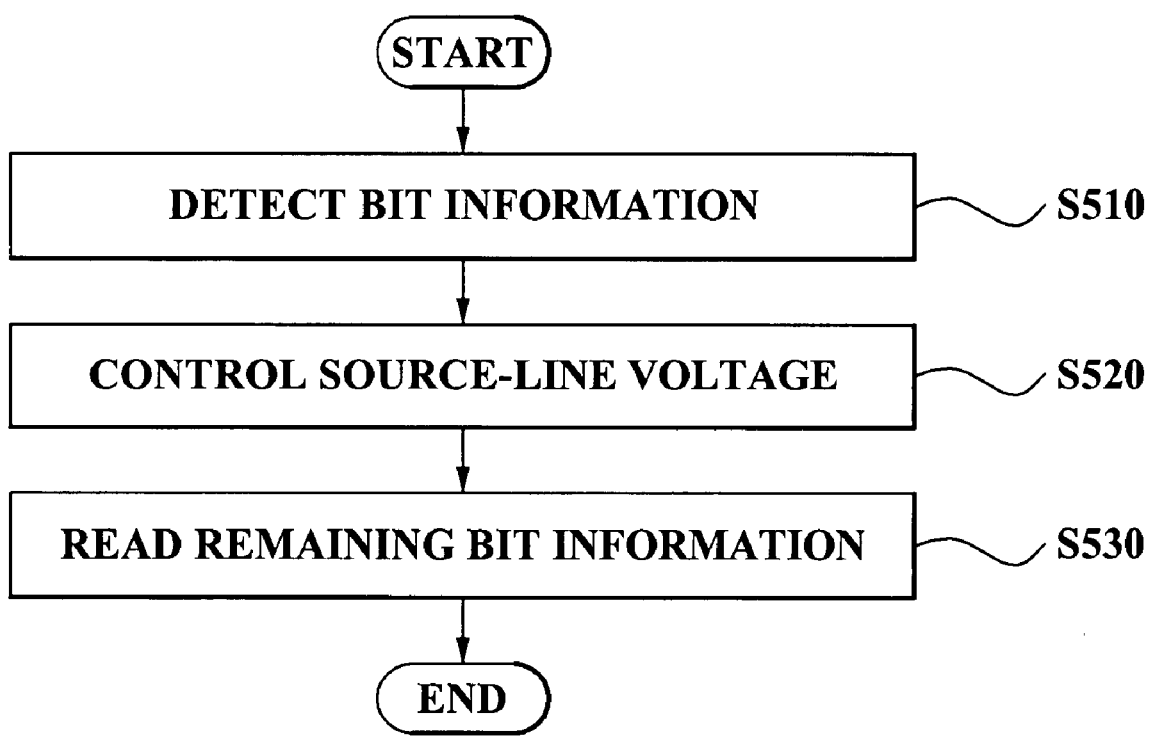
FIG. 5 is a flowchart illustrating a method of reading memory data according to an exemplary embodiment of the present invention.

FIG. 5 is a flowchart illustrating a method of reading memory data according to an exemplary embodiment of the present invention.

Referring to FIG. 5, as for a method of reading memory data according to an exemplary embodiment of the present invention, in operation S510, as much bit information as a predetermined number of bits from among multi-bit information stored in the memory cell is detected.

In this instance, in operation S510, a source-line voltage of the memory cell is maintained to be constant, and a gate voltage of the memory cell is controlled, thereby detecting the bit information.

Also, as for the method of reading memory data according to the present exemplary embodiment of the invention, in operation S520, the source-line voltage of the memory cell is controlled based on the detected bit information.

Also, as for the method of reading memory data according to the present exemplary embodiment of the invention, in operation S530, the remaining bit information stored in the memory cell is read by using the controlled source-line voltage.

Figure 6:
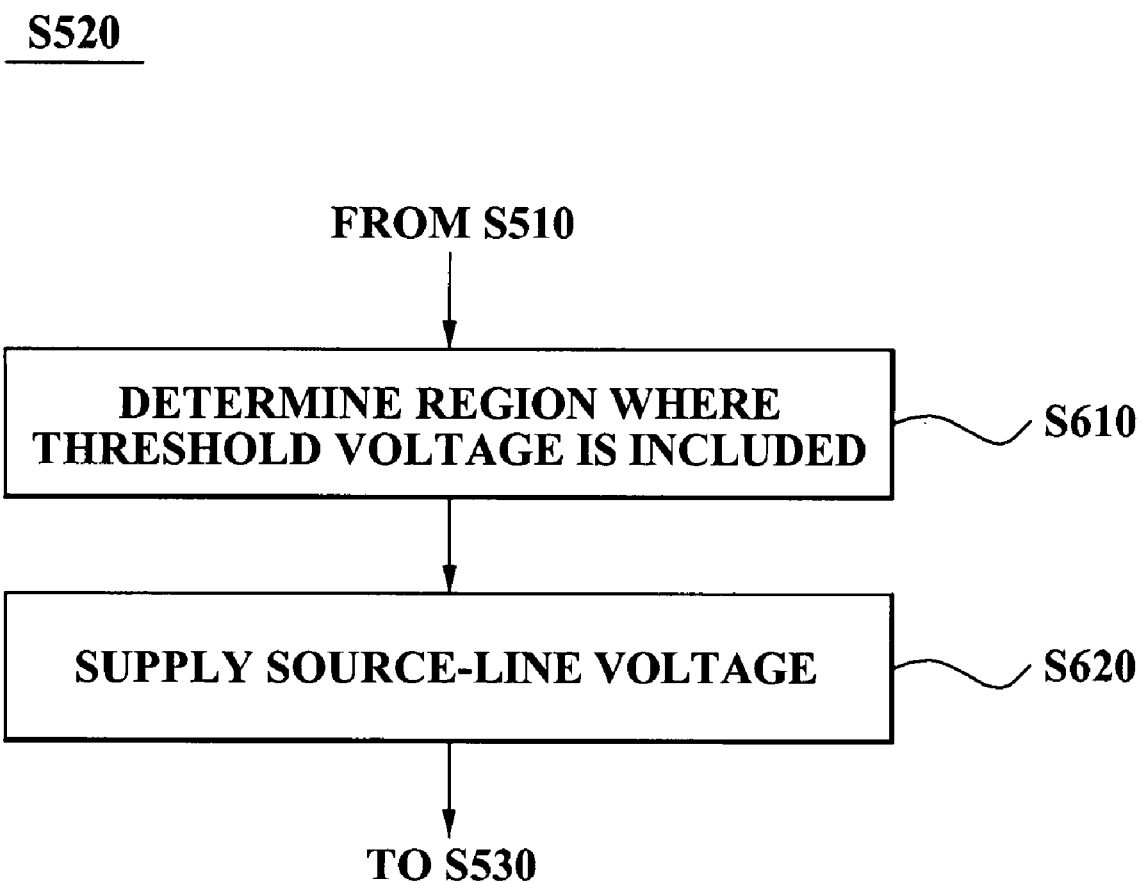
FIG. 6 is a flowchart illustrating an example of controlling a source-line voltage of FIG. 5.

FIG. 6 is a flowchart illustrating an example of controlling a source-line voltage of FIG. 5.

Referring to FIG. 6, in operation S610 of operation S520 of controlling a source-line voltage, a range of a region in which the threshold voltage of the memory cell is included is determined by using the detected bit information.

Also, in operation S620 of operation S520, the source-line voltage of the memory cell is supplied according to the range of the region in which the threshold voltage is included.

Although not shown in FIG. 6, in operation S530 of reading remaining bit information as described with reference to FIG. 5, a reference voltage is supplied to the gate of the memory cell, and the remaining bit information is read depending on whether a difference between the supplied source-line voltage and the reference voltage is greater than the threshold voltage of the memory cell.

Hitherto, referring FIGS. 5 and 6, the method of reading memory data according to the present invention has been described. In the method of reading memory data according to the present invention, detailed explanations of the above mentioned-exemplary embodiments with reference to FIGS. 1 through 4 are the same as descriptions with reference to FIGS. 5 and 6. Thus, hereinafter, detailed explanations thereto with respect to the method of reading memory data of the present invention will be omitted.

The method of reading memory data according to the present exemplary embodiment may be recorded in computer-readable media including program instructions to implement various operations embodied by a computer. The media may also include, alone or in combination with the program instructions, data files, data structures, and the like. The media and program instructions may be those specially designed and constructed for the purposes of the present invention, or they may be of the kind well-known and available to those having skill in the computer software arts. Examples of computer readable media include magnetic media such as hard disks, floppy disks, and magnetic tape; optical media such as CD ROM disks and DVD; magneto-optical media such as optical disks; and hardware devices that are specially configured to store and perform program instructions, such as read only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described embodiments of the present invention.

As described above, according to the present invention, a read speed is significantly increased by controlling a source-line voltage of a memory cell.

According to the present invention, a source-line voltage of a memory cell is appropriately controlled, so that data stored in the memory cell can be read without frequently changing a gate voltage applied to the memory cell.

Also, according to the present invention, predetermined bit information is detected, from among multi-bit information stored in a memory cell, and used, so that data stored in the memory cell is rapidly and accurately read.

Also, according to the present invention, the number of times reading memory data is performed is effectively reduced, so that overall performance of the memory device is improved.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A device for reading memory data, comprising:
   an information detection unit which detects as much bit information as a predetermined number of bits from among multi-bit information stored in a memory cell by controlling a gate voltage of the memory cell;
   a threshold voltage determination unit which determines a range of a region where a threshold voltage of the memory cell is included, by using the detected bit information from the information detection unit;
   a source-line voltage supply unit which controls a source-line voltage of the memory cell according to the range of the region where the threshold voltage is included; and
   a remaining bit information read unit which reads remaining bit information depending on whether a difference between the source-line voltage and a reference voltage which is supplied to a gate of the memory cell is greater than the threshold voltage of the memory cell.

* * * * *